United States Patent [19]
Miyakawa et al.

[11] Patent Number: 5,849,139
[45] Date of Patent: Dec. 15, 1998

[54] METHOD OF STICKING SEMICONDUCTOR WAFER AND ITS STICKING DEVICE

[75] Inventors: Kiyoharu Miyakawa; Osamu Morikawa, both of Miyazaki-gun, Japan

[73] Assignee: Komatsu Electronic Metals Co., Ltd., Hiratsuka, Japan

[21] Appl. No.: 824,780

[22] Filed: Mar. 26, 1997

[30] Foreign Application Priority Data

Mar. 29, 1996 [JP] Japan .................................. 8-112916

[51] Int. Cl.⁶ .................................................. B65G 49/07
[52] U.S. Cl. .................... 156/556; 156/583.3; 294/64.1; 29/743; 414/941
[58] Field of Search ................. 294/2, 64.1; 29/740, 29/743; 156/556, 572, 583.3, DIG. 31; 414/627, 737, 752, 935, 941; 901/40

[56] References Cited

U.S. PATENT DOCUMENTS

| | | | |
|---|---|---|---|
| 4,778,332 | 10/1988 | Byers et al. | 414/941 |
| 4,904,012 | 2/1990 | Nishiguchi et al. | 294/64.1 |
| 4,960,485 | 10/1990 | Ichinose et al. | 156/572 |
| 5,232,532 | 8/1993 | Hori | 29/740 |
| 5,685,588 | 11/1997 | Wong et al. | 294/64.1 |

FOREIGN PATENT DOCUMENTS 361-959   4/1990   European Pat. Off. ............... 414/941

*Primary Examiner*—Dean Kramer
*Attorney, Agent, or Firm*—Varndell Legal Group

[57] ABSTRACT

A method of sticking a semiconductor wafer and its sticking equipment. The semiconductor wafer can be flat and efficiently stuck on a plate. The semiconductor wafer, which has its inner surface coated with an adhesive, is tiltedly configured to permit raising a circumference to a height of Δh and located the wafer above a sticking position on the plate. The semiconductor wafer is pressed by a lower end of a stamp-press to be parallel to a surface of the plate. Then a vacuum chuck (2) stops sucking to release the semiconductor wafer from a transporting arm, and the transporting arm is moved away. The stamp-press is moved downward to press a whole surface of the semiconductor wafer.

9 Claims, 5 Drawing Sheets

METHOD OF STICKING SEMICONDUCTOR WAFER AND ITS STICKING DEVICE

BACKGROUND OF THE INVENTION

1. Field of the Invention

The present invention relates to a method of sticking a semiconductor wafer on a plate which is used to polish the semiconductor wafer, and its sticking equipment.

2. Description of Prior Art

To polish a semiconductor wafer, a prior-art method which sticks the semiconductor wafer on a plate by an adhesive comprises the steps as described below:

(1) referring to FIG. 5(a), transporting the semiconductor wafer 10 to a position above a sticking position on the plate 4 by a transporting equipment (not shown) having a prepress hand 5;

(2) referring to FIG. 5(b), putting the semiconductor wafer 10 on the plate 4 by the prepress hand 5, and providing at a pickup position a next semiconductor wafer 10b to be stuck at the same time;

(3) referring to FIG. 5(c), rotating the turntable 6 to transport the semiconductor wafer 10 put on the plate 4 to a position to be pressed, and then rotating the prepress hand 5 to pick up the next semiconductor wafer 10b to be stuck;

(4) referring to FIG. 5(d), sticking the semiconductor wafer 10 on the plate 4 through the pressing of the stamp-press 3, and rotating the prepress hand 5 to transport the semiconductor wafer 10b to the position above the sticking position on the plate 4.

Next, the movements of the prepress 5 hand are described below.

As shown in FIG. 6(a), the prepress hand 5 comprises a transporting arm 51; a vacuum chuck 52, which has a reversed-cup shape and is located at the front end of the transporting arm 51, for sucking the semiconductor wafer 10; and a lip 53, which is able to extend and withdraw, located at the center of the vacuum chuck 52.

The process of putting a semiconductor wafer 10 on the plate 4 by the prepress hand 5 comprises the steps of: as shown in FIG. 6(a), transporting the semiconductor wafer 10, which has its inner surface previously coated with the adhesive 11, to a position above the plate 4; then extending the lip 53 downward to press the semiconductor wafer 10, as shown in FIG. 6(b), and releasing the sucking of the vacuum chuck 52 at the same time, so that the semiconductor wafer 10 is put on the plate 4 and temporarily stuck at the center thereof. Thereafter, as shown in FIG. 5(d), complete sticking of the semiconductor wafer 10 being temporarily stuck is effected by the pressing of the stamp-press 3.

However, in the sticking process mentioned above, referring to FIG. 6(b), the semiconductor wafer 10, while being pressed to be temporarily stuck by the lip 53, has its center attached on the plate 4 prior to its circumference in the condition of having a slightly curved shape. The adhesive 11 used to temporarily adhere the circumference 11a becomes hardened during the period of rotating the plate 4 to the position where the semiconductor wafer 10 is to be pressed. This temporarily stuck circumference 11a tends to be slightly protruded due to the mix of air and surface tension. As shown in FIG. 6(c), since the temporarily stuck circumference 11a is protruded, a ring-shaped protrusion 10c is formed on the surface of the semiconductor wafer 10, and the adhesive 11 is hardened while the semiconductor wafer 10 remains in such a shape. Therefore, the semiconductor wafer 10 can not be flat polished due to the protrusion 10c even though the semiconductor wafer is pressed by the stamp-press 3.

Furthermore, the operating efficiency is unfavorable since operation for putting and operation for pressing the semiconductor wafer requires two separate operating movements.

SUMMARY OF THE INVENTION

Accordingly, to solve the above problems associated with the prior arts, an object of the present invention is to provide a method of sticking a semiconductor wafer and its sticking equipment, which can flat and efficiently stick the semiconductor wafer on a plate.

The method of sticking a semiconductor wafer according to the present invention is given here, which moves the semiconductor wafer to a position above a sticking position on the plate by a transporting arm used to suck the semiconductor wafer, and sticks the semiconductor wafer to the plate by pressing the semiconductor wafer by a stamp-press, wherein the semiconductor wafer is configured to be tilted so as to permit a front end of the transporting arm having a higher circumference thereof while the semiconductor wafer is transported to a position above the sticking position on the plate, the semiconductor wafer is then put on the plate by releasing a sucking of the transporting arm at the time when the semiconductor wafer is substantially parallel to the surface of the plate through the pressing of a stamp-press, thereafter the transporting arm is moved away, and the semiconductor wafer is depressed by the stamp-press.

Moreover, according to the present invention, the equipment for sticking a semiconductor wafer comprises a transporting arm which is provided with a vacuum chuck to suck the semiconductor wafer; and a stamp-press, which is elastic and substantially hemispherical, being able to press a whole surface of the semiconductor wafer; wherein the vacuum chuck is formed to support at least two points which are located at opposite positions corresponding to a substantial center of the semiconductor wafer and positioned on a circumference of the surface of the semiconductor wafer, wherein a width between the points permits at least a lower end of the stamp-press to insert therein.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Embodiment 1

Figure 2:
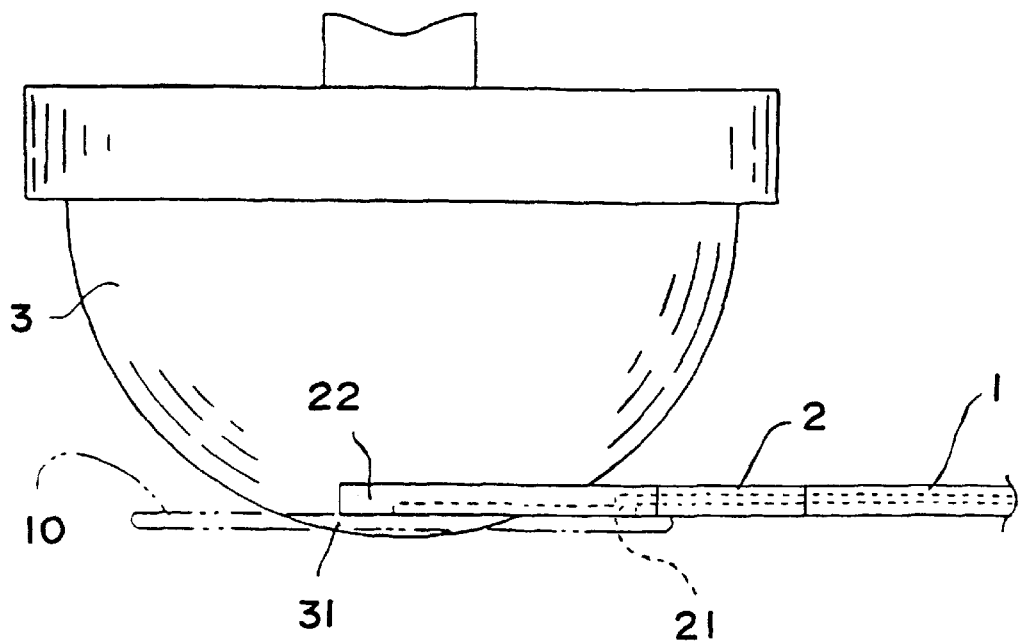
FIG. 2 is a diagram illustrating the partial side-view of the sticking equipment of a semiconductor wafer according to a first embodiment of the present invention.

Referring to FIG. 2, the sticking equipment of the first embodiment comprises: a transporting arm 1 for transporting a semiconductor wafer 10; and a stamp-press 3 for pressing the surface of the semiconductor wafer 10.

Figure 3:
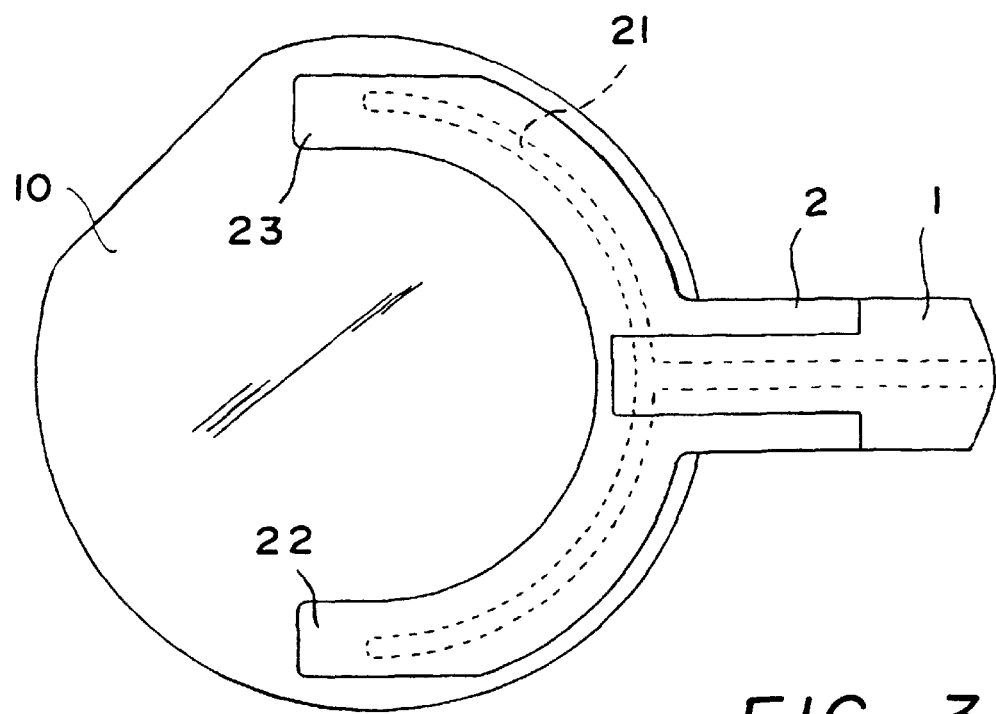
FIG. 3 is a are partial plane diagram illustrating the transporting arm of the first embodiment according to the present invention.

Referring to FIG. 3, the transporting arm 1 includes a vacuum chuck 2, which is substantially U-shaped and located at the front end thereof, for sucking the surface of the semiconductor wafer 10. A sucking groove 21, which is formed along the circumference of the semiconductor wafer 10 and has a substantially semicircular shape, is provided on the vacuum chuck 2, the semiconductor wafer 10 is thereby sucked by the sucking groove 21.

Referring to FIG. 2, the stamp-press 3 is substantially hemispherical. Since the stamp-press is elastic, the deformed surface being pressed is gradually enlarged while the lower end 31 of the stamp-press starts contacting the surface of the semiconductor wafer 10. The whole surface of the semiconductor wafer 10 is thus able to be uniformly pressed.

Referring to FIG. 3, the two front ends 22, 23 of the vacuum chuck 2 are located at the opposite positions corresponding to the substantial center of the semiconductor wafer 10. As shown in FIG. 2, the width between the two front ends 22, 23 permits the lower end 31 of the stamp-press 3 to insert therein.

Next, the sticking method of a semiconductor wafer of the present invention utilizing the sticking equipment of the first embodiment is described.

Figure 1A:
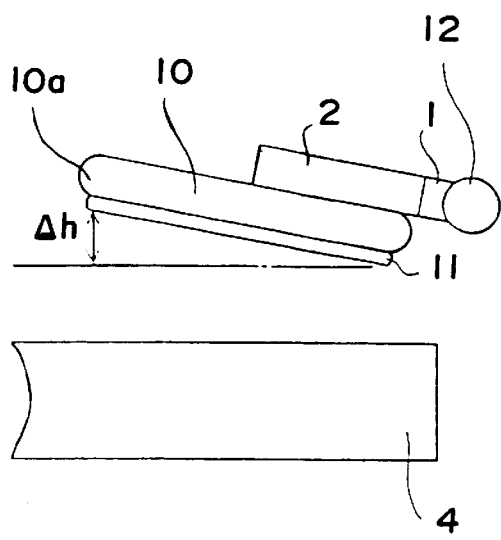
FIGS. 1(a) to 1(d) are diagrams illustrating the modes of the sticking method of a semiconductor wafer according to the present invention.

Referring to FIG. 1(a), being sucked by the vacuum chuck 2 of the transporting arm 1, the semiconductor wafer 10, which has its inner surface coated with the adhesive 11, can be transported. At this time, the transporting arm 1 is transported to a position above a sticking position on the plate 4 by means of the servo-motor 12 at the equipping part, having its front end slightly lifted. Therefore, the semiconductor wafer 10 is configured to be tilted to permit the circumference 10a of the front end of the transporting arm 1 to be raised to a height of Δh.

The magnitude of Δh is varied with different diameters of the semiconductor wafer 10, i.e., about 1 mm for 200 mm wafer.

Figure 1C:
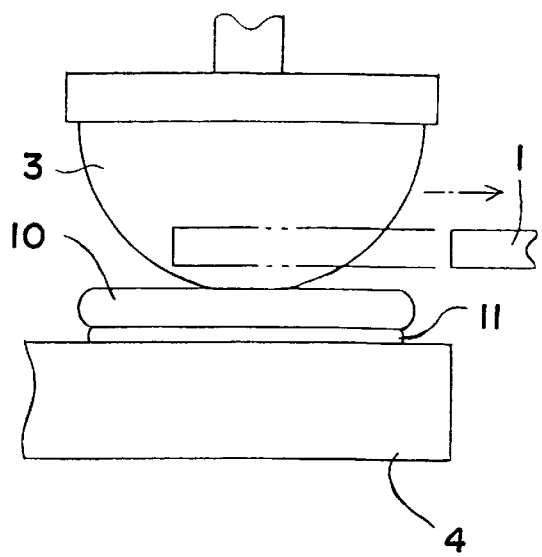
Figure 1B:
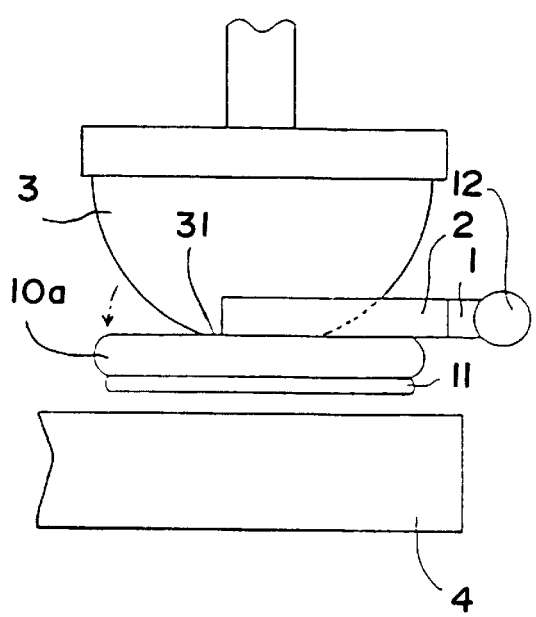
Figure 1D:
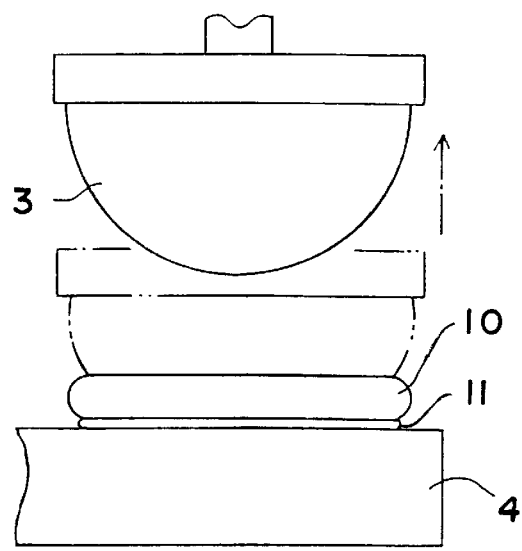

Referring to FIG. 1b, the stamp-press 3 is moved down to make its lower end 31 contact to the central surface of the semiconductor wafer 10, so that the semiconductor wafer 10 is pressed. Further, the both front ends 22, 23 of the vacuum chuck 2 are pressed to lower the circumference 10a of the semiconductor wafer 10.

Referring to FIG. 1(c), at the time when the semiconductor wafer 10 is substantially parallel to and touching the surface of the plate 4, the vacuum chuck 2 stops sucking the semiconductor wafer 10, so that the transporting arm 1 releases the semiconductor wafer 10 and is then moved away. As a result, the semiconductor wafer 10 can be put flat on the surface of the plate 4.

Referring to FIG. 1(c), the stamp-press 3 is moved down more to press the whole surface of the semiconductor wafer 10, so that the semiconductor wafer 10 is simultaneously stuck on the plate 4 through the putting and pressing movements. The semiconductor wafer 10 can be pressed continuously from the center to the circumference by the stamp-press 3. Thereby, the air between the adhesive 11 and the plate 4 can be pushed out at a stretch, and the whole semiconductor wafer 10 can be uniformly pressed.

This method prevents only a part of the adhesive 11 hardening first, or having the adhesive 11 harden by mixing with air.

Embodiment 2

Figure 4:
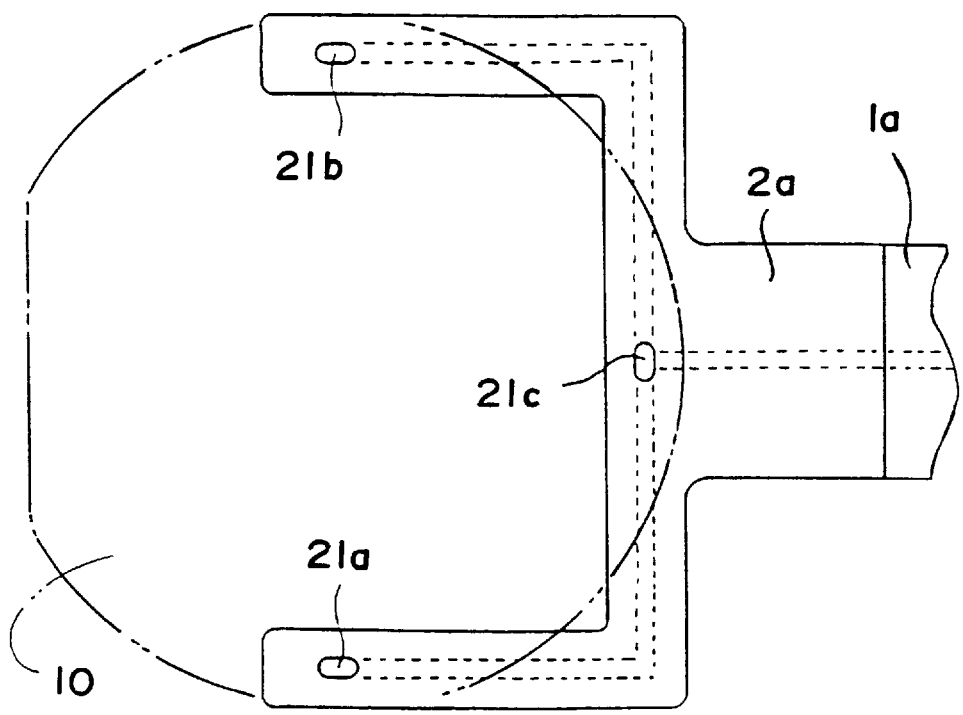
FIG. 4 is a partial plane diagram illustrating the transporting arm of the second embodiment according to the present invention.
Figure 5A:
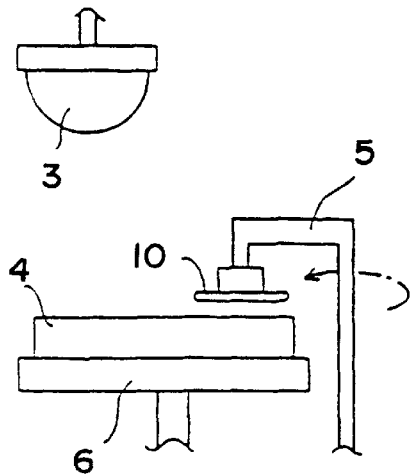
FIGS. 5(a) to 5(d) are diagrams illustrating the modes of the prior-art sticking method.
Figure 5B:
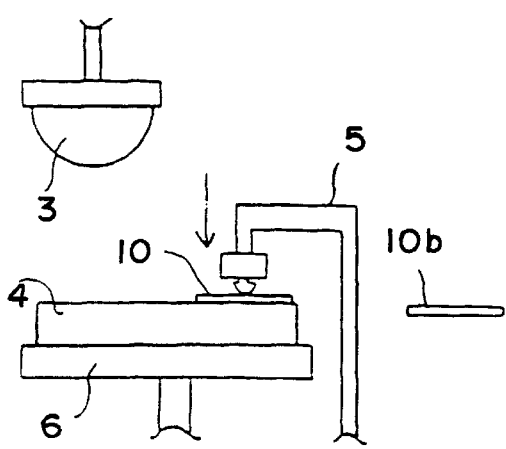
Figure 5C:
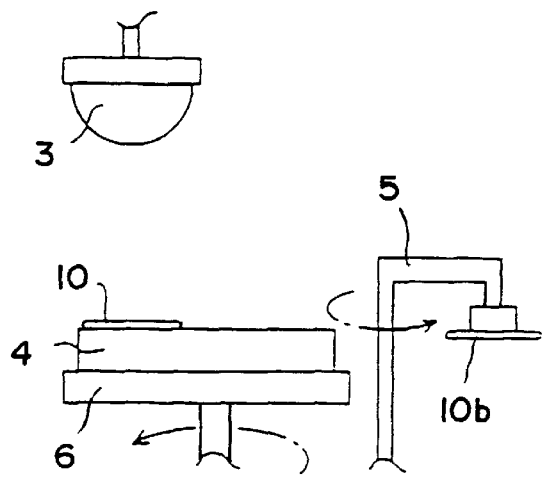
Figure 5D:
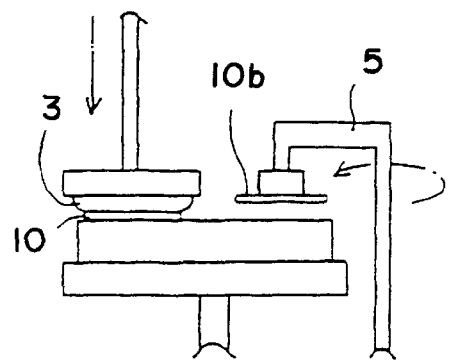
Figure 6A:
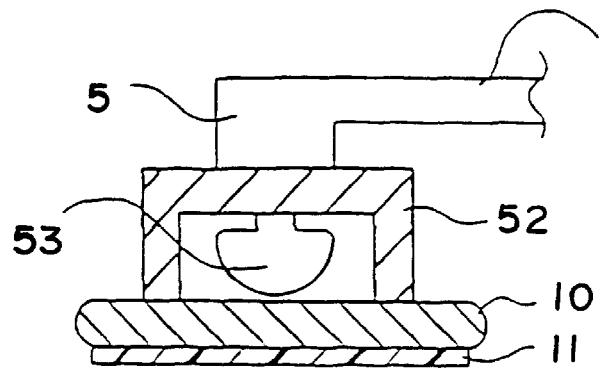
FIGS. 6(a) to 6(c) are diagrams is a diagram illustrating the partial side-view of the prior-art sticking equipment.
Figure 6B:
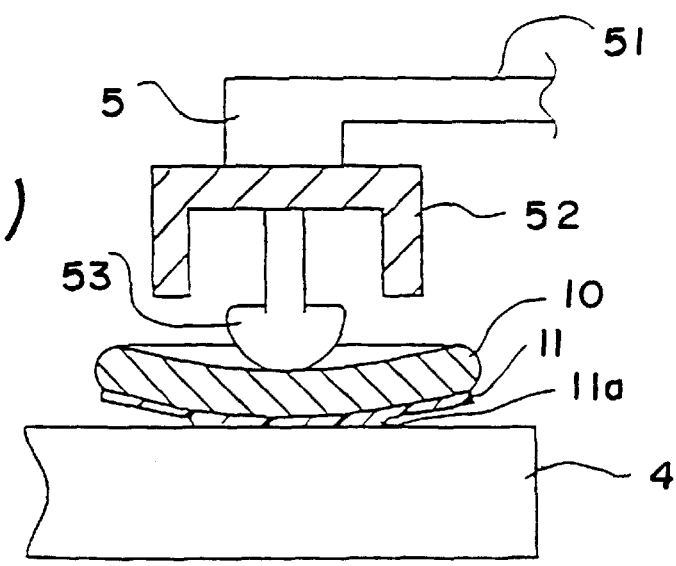
Figure 6C:
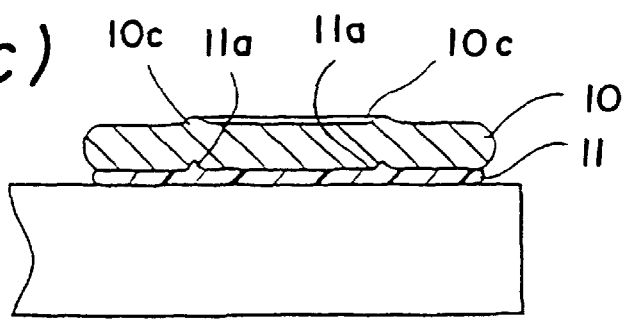

FIG. 4 is a partial plane diagram illustrating the transporting arm of the second embodiment.

In embodiment 1, the vacuum chuck 2 is substantially U-shaped, the sucking groove 21 is formed, but not limited, to a substantially semicircular shape. The adherence of a semiconductor wafer in accordance with the sticking method of the present invention can be accomplished, only if at least two points, which are located at the circumference and at the opposite positions corresponding to a substantial center of the semiconductor wafer, are positively supported.

Further, as shown in FIG. 4, the transporting arm 1a of the second embodiment has the vacuum chuck 2a at its front end substantially formed in a two-prong fork shaped. Sucking forth 21a, 21b, 21c are respectively set up at the two front ends and the middle, and configured as an isosceles triangle.

Due to the constitution mentioned above in the present invention, the surface of a semiconductor wafer can be pressed continuously from the center to the circumference at a stretch by a stamp-press. This prevents only a part of the adhesive hardening first, or having the adhesive harden by mixing with air.

Moreover, since the semiconductor wafer can be simultaneously stuck through the putting and pressing movements, the efficiency of sticking a semiconductor wafer to the plate is remarkably improved in comparison with the prior-art method.

What is claimed is:

1. A method of sticking a semiconductor wafer onto a plate, including transporting the semiconductor wafer to a position above a sticking position on the plate by a transporting arm used to hold the semiconductor wafer by vacuum action, and sticking the semiconductor wafer to the plate by pressing the semiconductor wafer by a stamp-press, wherein:

during the transporting, the transporting arm is tilted so that a front end of the semiconductor wafer is maintained at a fixed distance higher than a rear end of the semiconductor wafer while the semiconductor wafer is transported to a position above the sticking position on the plate, and during the sticking of the semiconductor wafer to the plate, the semiconductor wafer is released by the transporting arm while the semiconductor wafer is held substantially parallel to a surface of the plate by pressing of the stamp-press, the transporting arm is moved away from the plate, and the semiconductor wafer is then pressed against the plate by the stamp-press.

2. A method of sticking a semiconductor wafer onto a plate as claimed in claim 1, wherein the transporting arm is moved away from the plate in a rearward direction.

3. The sticking method of a semiconductor wafer as claimed in claim 1, wherein the transporting arm is provided with a vacuum chuck to suck the semiconductor wafer; and the stamp-press is elastic, substantially hemispherical, and capable of pressing a whole surface of the semiconductor wafer; and wherein the vacuum chuck is formed to support at least two points which are located at opposite positions corresponding to a substantial center of the semiconductor wafer and positioned on a circumference of the surface of the semiconductor wafer, a width between the points permitting at least a lower end of the stamp-press to insert therein.

4. The sticking method of a semiconductor wafer as claimed in claim 3, wherein the sucking portion of the vacuum chuck comprises sucking holes located at the two points, which are located at opposite positions corresponding to the substantial center of the semiconductor wafer and on the circumference of the surface of the semiconductor wafer, and at a point which the surface of the semiconductor wafer, and at a point which constitutes an isosceles triangle with the two points and which is positioned on the circumference of the surface of the semiconductor wafer.

5. The sticking method of a semiconductor wafer as claimed in claim 3, wherein the sucking portion of the vacuum chuck is a sucking groove connecting the two points which are located at opposite positions corresponding to the substantial center of the semiconductor wafer and positioned on the circumference of the surface of the semiconductor wafer, and which form a curved shape along the circumference of the semiconductor wafer.

6. A method of sticking a semiconductor wafer onto a plate, including transporting the semiconductor wafer to a position above a sticking position on the plate by a transporting arm used to hold the semiconductor wafer by vacuum action, and sticking the semiconductor wafer to the plate by pressing the semiconductor wafer by a stamp-press, wherein:

during the transporting, the transporting arm is tilted so that a front end of the semiconductor wafer is maintained a fixed distance higher than a rear end of the semiconductor wafer while the semiconductor wafer is transported to a position above the sticking position on the plate, and during the sticking of the semiconductor wafer to the plate, the semiconductor wafer is held by the transporting arm while pressed by the stamp-press, the semiconductor wafer contacts a surface of the plate by pressing of the stamp-press, the transporting arm is moved away from the plate, and the semiconductor wafer is pressed against the plate by the stamp-press.

7. A method of sticking a semiconductor wafer onto a plate as claimed in claim 6, wherein the transporting arm is moved away from the plate in a rearward direction.

8. A method of sticking a semiconductor wafer onto a plate, including transporting the semiconductor wafer to a position above a sticking position on the plate by a transporting arm used to hold the semiconductor wafer by vacuum action, and sticking the semiconductor wafer to the plate by pressing the semiconductor wafer by a stamp-press, wherein:

during the transporting, the transporting arm is tilted so that a front end of the semiconductor wafer is maintained a fixed distance higher than a rear end of the semiconductor wafer while the semiconductor wafer is transported to a position above the sticking position on the plate, and during the sticking of the semiconductor wafer to the plate, the semiconductor wafer is held by the transporting arm while pressed by the stamp-press, the transporting arm and the stamp-press are moved so that the semiconductor wafer contacts a surface of the plate by pressing of the stamp-press, and the transporting arm is moved away from the plate, and the semiconductor wafer is pressed against the plate by the stamp-press.

9. A method of sticking a semiconductor wafer onto a plate as claimed in claim 8, wherein the transporting arm is moved away from the plate in a rearward direction.

* * * * *